United States Patent [19]
Rand

[11] 3,889,359
[45] June 17, 1975

[54] OHMIC CONTACTS TO SILICON

[75] Inventor: Myron Joel Rand, Bethlehem, Pa.

[73] Assignee: Bell Telephone Laboratories, Incorporated, Murray Hill, N.J.

[22] Filed: Dec. 10, 1973

[21] Appl. No.: 422,996

[52] U.S. Cl. .......... 29/578; 29/590
[51] Int. Cl. .......... B01j 17/00
[58] Field of Search .......... 29/578, 589, 590

[56] References Cited

UNITED STATES PATENTS 3,274,670 9/1966 Lepselter .......... 29/578
3,545,076 12/1970 Schulten .......... 29/578
3,590,471 7/1971 Lepselter .......... 29/578

*Primary Examiner*—W. Tupman
*Attorney, Agent, or Firm*—H. W. Lockhart

[57] ABSTRACT

Ohmic contact to relatively high resistivity n-type silicon is made by forming a thin layer of platinum on the silicon surface by means of chemical vapor deposition (CVD) using a phosphorus compound of platinum. The structure then is sintered by heating at about 700° C. for from five to ten minutes thereupon forming a good ohmic contact of the platinum silicide type without the necessity of the separate impurity diffusion treatment usually required to increase the surface impurity concentration.

5 Claims, 2 Drawing Figures

OHMIC CONTACTS TO SILICON

BACKGROUND OF THE INVENTION

It is a well-known practice in the semiconductor art to make ohmic contacts to silicon in accordance with the teaching of U.S. Pat. No. 3,274,670 issued to M. P. Lepselter wherein platinum is deposited by cathodic sputtering or vacuum evaporation in a thin film upon a portion of a silicon semiconductor surface. The assembly then is heated at a temperature in excess of about 500° C. for a short period which effects a sintering process to form areas of platinum silicide film. Subsequently another metal, for example, titanium, is deposited over the platinum silicide film as a basis for additional metallization patterns.

It is known also, in accordance with the disclosure of U.S. Pat. No. 3,290,127 to M. P. Lepselter wherein palladium is utilized in place of platinum and the sintering operation is accomplished at a lower temperature, to form a Schottky-barrier, rectifying contact to the silicon. Moreover, in accordance with either of these techniques and metals, it is necessary to provide a relatively high concentration of significant impurity in the surface portion of the silicon to insure ohmic contact to the semiconductor body. For this purpose it is the general practice to carry out a separate impurity diffusion to enhance the conductivity of such surface portion. This step also requires an additional mask definition and etching treatment and, accordingly, adds to the complexity of the process. More importantly, the diffusion heat treatment requires temperatures in excess of 900° C. which may deleteriously affect other portions of the device structure. It is therefore an object of this invention to simplify the fabrication of ohmic contacts, particularly to silicon semiconductor material of higher resistivities in the range from about 0.1 to 10 ohm-centimeters and above.

SUMMARY OF THE INVENTION

In accordance with this invention platinum silicide ohmic contact is made to n-type conductivity silicon semiconductor material, for example, in the specific range of 3 to 5 ohm-centimeters, such as is used typically for the fabrication of insulated gate field effect transistors. After the fabrication of the device structure by the formation of conductivity type zones by diffusion or ion implantation or equivalent means, a mask is formed on the surface to which contact is to be made. Typically such a mask is delineated in a film of silicon dioxide in accordance with methods well known in the art. A film of platinum having a thickness of from about 500 to 700 angstroms then is deposited over the entire surface. Uniquely, however, this deposition is accomplished by means of the so-called chemical vapor deposition process. This process is based on a thermal dissociation of a platinum-phosphorus trifluoride compound which produces a film of platinum. Following the deposition of a platinum film in accordance with this technique, it is necessary only to carry out the sintering heat treatment at a temperature of about 700° C. for from 5 to 10 minutes to produce a platinum silicide contact of the usual form which has excellent ohmic characteristics to the underlying silicon. This result is achieved without the usual separate high-temperature diffusion heat treatment of the contact area using an n-type impurity to enhance the conductivity of the surface portions. There is thus eliminated not only the separate heat treatment but a mask definition step and the etching of the surface oxide formed during such heat treatment. In the absence of such conductivity enhancement, the platinum silicide formed by deposition methods other than the chemical vapor deposition will produce a Schottky-barrier, rectifying contact.

DESCRIPTION OF THE DRAWING

The invention and its other objects and features will be more clearly understood from the following detailed description taken in conjunction with the drawing in which.

DETAILED DESCRIPTION

Figure 1:
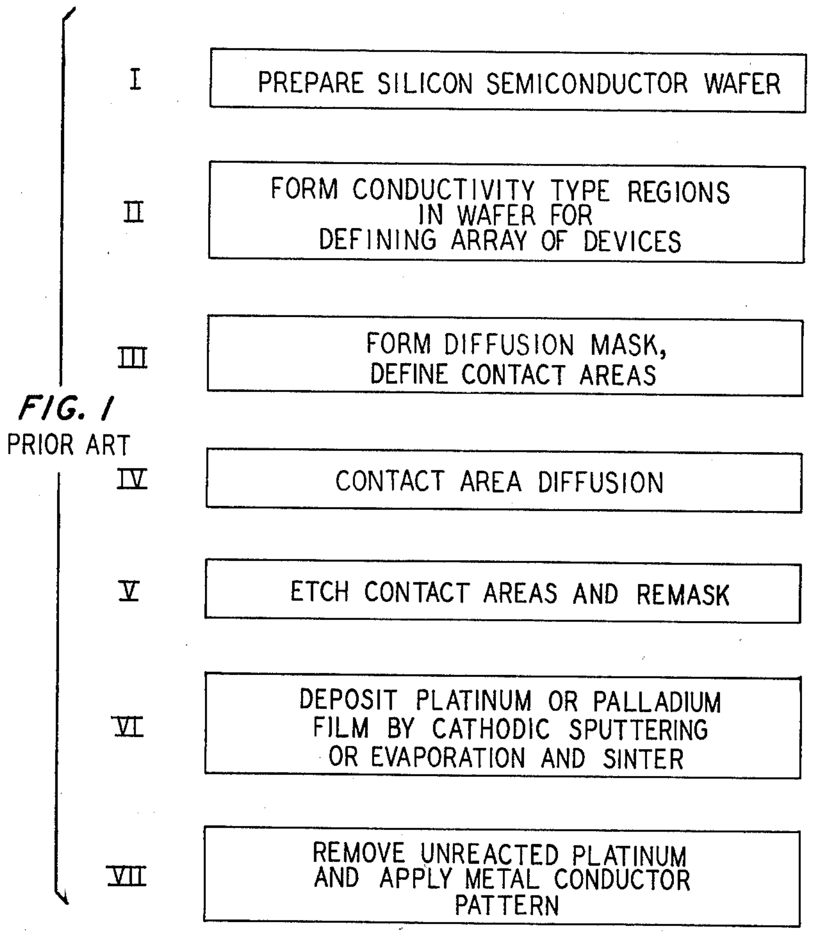
FIG. 1 PRIOR ART
FIG. 1 is a flowchart setting forth steps in the partial fabrication of semiconductor devices in accordance with the prior art for forming an ohmic contact.

In accordance with the prior art, a silicon semiconductor wafer is processed for the fabrication therein of an array of insulated gate field effect transistors as described in FIG. 1. This process conforms, in general, to that described in the article by R. Burock, J. R. DeBolt, and R. N. Parente entitled "Manufacturing Beam Lead, Insulated-Gate, Field Effect Transistor (IGFET) Integrated Circuits," *The Western Electric Engineer*, Vol. XVII, No. 3 (July 1973) p. 3. Typically, as indicated in Block I, the IGFET array is formed from a monocrystalline silicon substrate material having a thickness of several mils and a diameter of 2 or 3 inches. Also, typically such a substrate may be of fairly low resistivity, for example 0.01 ohm-centimeter, containing antimony as a significant impurity to produce *n*+ conductivity. There is formed on one surface of this substrate an epitaxial film of silicon having a thickness of from seven to ten microns of arsenic doped n-type silicon with a resistivity for example of from 8 to 20 ohm-centimeters. Next, referring to Block II, in accordance with techniques well known in the art, there is formed in the epitaxial layer an array of insulated gate field effect transistors each comprising a source, a drain, and an intervening channel region. Then, as set forth in Block III, prior art practice calls for the formation of a silicon dioxide film mask which defines the contact zones on the epitaxial face of the slice. As described in Block IV, the wafer then is subjected to an n-type impurity diffusion heat treatment using, for example, phosphorus, to enhance the n-type conductivity of the exposed silicon surface. This diffusion heat treatment at a temperature of 900° C. or higher, most typically about 1000° C., may have a considerable effect upon the distribution of significant impurities already present in the semiconductor material for defining device structures, and also on the properties of the silicon-silicon dioxide interface in the gate region, which are known to affect the electrical behavior of the device. At the least, it is necessary in designing the device processing to take into account the effect of this final diffusion heat treatment, a consideration which, in some instances, may require a compromise of device characteristics.

Following the diffusion heat treatment, the oxide formed within the contact areas is removed typically by chemical etching and the surface is remasked as specified in Block V. The wafer is then subjected to platinum deposition by a cathodic sputtering process, as described in Block VI, to form a film of platinum over the entire surface having a thickness of about 700 angstroms. Alternatively, platinum may be deposited by electron beam evaporation. These energetic deposition techniques, although generally satisfactory for bipolar devices, introduce a level of radiation damage in unipolar devices, such as IGFETs, which has led to the substitution of palladium for platinum in such devices. Palladium can be deposited by thermal evaporation, avoiding radiation effects.

Next, the wafer is heated at about 550° to 600° C. for from five to ten minutes to effect an interdiffusion between the platinum and the silicon in the contact areas. Then, as specified in Block VII, the unreacted platinum overlying the oxide film surface is removed by etching in aqua regia. The fabrication process continues with formation of the metal conductor pattern in accordance with techniques known in the art.

Figure 2:
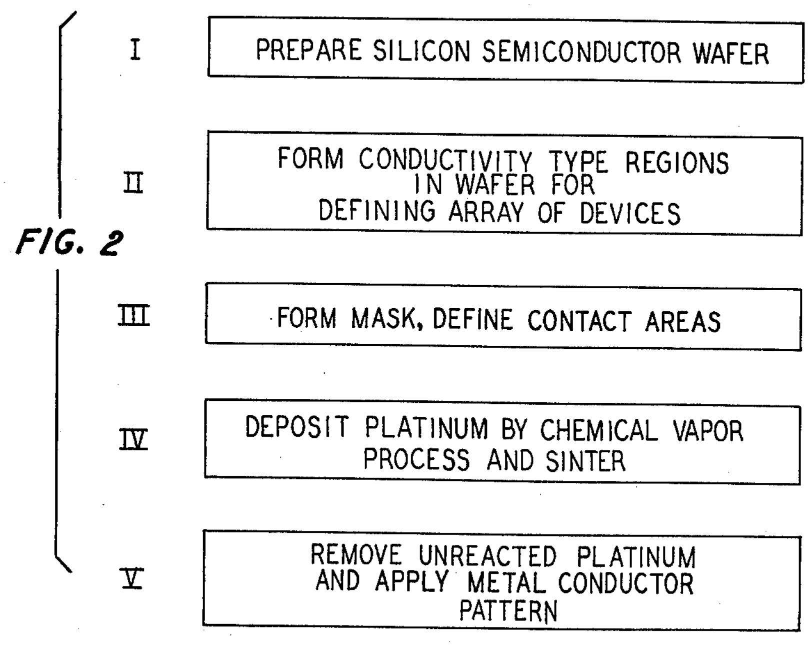
FIG. 2 is a flowchart setting forth the analogous steps in accordance with this invention.

In contrast with the foregoing prior art process, the technique in accordance with this invention as disclosed in FIG. 2, utilizes similar starting material and initial processing steps to form the array of devices as described in Blocks I and II. However, once the contact areas have been defined by a silicon dioxide mask, as described in Block III, the method omits the separate high temperature diffusion and proceeds directly to deposition of a platinum film about 700 angstroms thick, formed as specified in Block IV, by the chemical vapor deposition technique.

This process, in one specific form, employs the compound tetrakis (trifluorophosphine) platinum, $Pt(PF_3)_4$, a colorless, volatile, and reasonably stable liquid. The vapor of this compound is picked up by gas flowing through a saturator, diluted with a carrier gas, and passed at one atmosphere over the heated silicon wafer. The compound decomposes to a bright platinum film on the silicon surface and a gas, $PF_3$. The process may be carried out at a temperature in the range from 100° to 500° C., with the substrate typically at about 225° C. The carrier may be either hydrogen or an inert gas such as nitrogen or argon. In one specific embodiment using hydrogen and a process temperature of 250° C. the deposition rate of platinum was between 50 and 100 A/minute.

Next, as further specified in Block IV, the platinum silicide is formed by an interdiffusion heat treatment at about 700° C. to produce an ohmic contact to the silicon. As in the prior art technique, the unreacted platinum may be removed by aqua regia and the metal conductor pattern applied as shown in Block V.

It is believed that the advantageous result enabling the elimination of the separate diffusion heat treatment is a consequence of some phosphorus diffusion provided by the chemical vapor deposition technique in accordance with this invention. Such diffusion generally is unexpected because of the small amount of residual phosphorus and because the vapor pressure of the phosphorus would tend to dissipate the element. It has, however, been found to be a most advantageous technique for making ohmic contact to silicon of the higher resistivity ranges currently favored for silicon semiconductor devices of the IGFET or MOSFET type. In particular, although a temperature of 700° C. has been indicated for the step of forming platinum silicide, temperatures in the range from 675° to 750° C. may be used satisfactorily. It is important to note that these temperatures have little or no effect upon the significant impurity distribution within the semiconductor, in contrast to the possible effect of a 1000° C. treatment for the phosphorus contact diffusion.

Moreover, the deposition of platinum by the chemical vapor technique in lieu of energetic processes including sputtering and electron gun evaporation avoids the consequent radiation damage produced by these processes. At the present time, insofar as applicant is aware, these are the only useful alternatives to the chemical vapor process for depositing platinum of the required thickness. The effects of radiation are particularly deleterious to the thin insulating film of the gate area of semiconductor devices of the insulated gate or thin film type. Thus, the process in accordance with this invention enables the use of platinum for unipolar devices similar to the bipolar device metallization, rather than requiring a departure to palladium.

Although the invention has been described in terms of certain specific embodiments, it will be understood to apply to a wide range of silicon semiconductor device fabrication. Its efficacy stems from the feature that excellent low resistance contact can be made even to relatively high resistivity material simply by depositing the initial contact metal by the chemical vapor process followed by the sintering heat treatment step. Thus the devices being fabricated may be other than IGFETs and contact may be to material formed in a variety of ways.

Moreover, within the ambit of this disclosure, chemical vapor deposition is intended to encompass only the reactive process described hereinabove with respect to trifluorophosphine or trifluorophosphine hydride compounds. It will also be understood that relatively high resistivity material refers to semiconductor material which in the absence of the practice of this invention requires an impurity enhancement treatment to enable satisfactory ohmic contact.

It should be noted also that the vapor deposition process in accordance with this invention may be practiced with other metals than platinum that have trifluorophosphine compounds such as nickel, chromium tungsten, and molybdenum.

What is claimed is:

1. In the fabrication of a silicon semiconductor device which includes the step of introducing into a portion of a p-type conductivity silicon semiconductor body an n-type impurity to convert the conductivity type of said portion to an n-type conductivity zone, the further steps of forming a silicon oxide mask on the surface of said portion to define a contact area thereto and proceeding directly as a next step to deposit on said masked surface portion by the process of chemical vapor deposition a thin layer of platinum, said process comprising exposing said masked surface portion to a gaseous ambient containing a vapor of a phosphorous compound of platinum while said semiconductor body is at a temperature of between 100° and 500° C., followed by heating said body at a temperature of from about 675° C. to 750° C. for a period of from 5 to 10 minutes.

2. The process in accordance with claim 1 in which the platinum layer has a thickness of from about 500 to 700 angstroms.

3. The process in accordance with claim 2 in which said portion has a resistivity in the range from about 2 to 10 ohms centimeters.

4. The process in accordance with claim 1 in which the phosphorous compound of platinum is tetrakis (trifluorophosphine) platinum, Pt $(PF_3)_4$.

5. The process in accordance with claim 4 in which the temperature of the semiconductor body during the chemical vapor deposition step is about 225° C. and the deposition period is for about 5 to 10 minutes.

* * * * *